(12) United States Patent
Shim et al.

(10) Patent No.: US 7,741,634 B2
(45) Date of Patent: Jun. 22, 2010

(54) JOSEPHSON JUNCTION DEVICE FOR SUPERCONDUCTIVE ELECTRONICS WITH A MAGNESIUM DIBORIDE

(75) Inventors: Heejae Shim, Medford, NY (US); Jagadeesh S. Moodera, Somerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 240 days.

(21) Appl. No.: 12/055,593

(22) Filed: Mar. 26, 2008

(65) Prior Publication Data

US 2009/0247410 A1    Oct. 1, 2009

(51) Int. Cl.
H01L 23/48    (2006.01)
H01L 29/08    (2006.01)
H01L 21/00    (2006.01)

(52) U.S. Cl. ............ 257/36; 257/E39.006; 438/2; 505/190; 505/329

(58) Field of Classification Search ............ 257/31, 257/36, E39.001, E39.006; 438/2; 505/190, 505/329
See application file for complete search history.

(56) References Cited

U.S. PATENT DOCUMENTS

| 6,797,341 | B2  | 9/2004  | Zeng et al.     |         |
|-----------|-----|---------|-----------------|---------|
| 6,929,820 | B2  | 8/2005  | Shimakage et al.|         |
| 6,946,428 | B2* | 9/2005  | Rey             | 505/237 |
| 2002/0132739 | A1 | 9/2002 | Kang et al.    |         |
| 2002/0189533 | A1 | 12/2002 | Kim et al.    |         |
| 2004/0099861 | A1 | 5/2004 | Shoji et al.   |         |

| 2004/0234785 | A1 | 11/2004 | Liu et al. |

FOREIGN PATENT DOCUMENTS

| JP | 09181365      | 1/1997 |
| JP | 2006237384    | 9/2006 |
| KR | 10-2003-0024423 | 1/2003 |
| KR | 10-20030039563 | 5/2003 |
| KR | 10-2004-00787478 | 9/2004 |

OTHER PUBLICATIONS

Shimakage et al., "All-MgB2 tunnel junctions with aluminum nitride barriers" Applied Physics Letters, 86, 2005 American Institute of Physics, pp. 072512-1-072512-3.
Chen et al., "Planar MgB2 superconductor-normal metal-superconductor Josephson junctions fabricated using epitaxial MgB2/TiB2 bilayers" Applied Physics Letters 88, 2006 American Institute of Physics, pp. 222511-1-222511-3.
Ueda et al., "All-MgB2 Josephson tunnel junctions" Applied Physics Letters 86, 2005 American Institute of Physics, pp. 172502-1-172502-3.
Kim et al., "Demonstration of all in situ magnesium diboride superconductor thin-film tunnel junctions" Applied Physics Letters, vol. 85, No. 3, Jul. 19, 2004, 2004 American Institute of Physics, pp. 434-436.

* cited by examiner

*Primary Examiner*—W. David Coleman
(74) *Attorney, Agent, or Firm*—Gauthier & Connors LLP

(57) ABSTRACT

A Josephson junction (JJ) device includes a buffered substrate comprising a first buffer layer formed on a substrate. A second buffer layer is formed on the first buffer layer. The second buffer layer includes a hexagonal compound structure. A trilayer structure is formed on the buffered substrate comprising at least two layers of a superconducting material. A thin tunnel barrier layer is positioned between the at least two layers. The buffered substrate is used to minimize lattice mismatch and interdiffusion in the trilayer structure so as to allow the JJ device to operate above 20 K.

22 Claims, 8 Drawing Sheets

| Boride compounds | Cell size (Å) | |
|---|---|---|
| | a | c |
| RuB$_2$ | 2.852 | 2.855 |
| OsB$_2$ | 2.8761 | 2.8709 |
| Thetha-CrB$_2$ | 2.969 | 3.066 |
| AgB$_2$ | 3 | 3.24 |
| VB$_2$ | 3.006 | 3.056 |
| MnB$_2$ | 3.007 | 3.037 |
| TiB$_2$ | 3.0245 | 3.2326 |
| MoB$_2$ | 3.05 | 3.113 |
| TaB$_2$ | 3.078 | 3.265 |
| MgB$_2$ | 3.0834 | 3.5213 |
| UB$_2$ | 3.13 | 3.99 |
| AuB$_2$ | 3.14 | 3.52 |
| HfB$_2$ | 3.142 | 3.477 |
| ScB$_2$ | 3.146 | 3.517 |
| ZrB$_2$ | 3.167 | 3.529 |
| PuB$_2$ | 3.18 | 3.9 |
| LuB$_2$ | 3.246 | 3.704 |

FIG. 1B

JOSEPHSON JUNCTION DEVICE FOR SUPERCONDUCTIVE ELECTRONICS WITH A MAGNESIUM DIBORIDE

This invention was made with government support awarded by the Office of Naval Research under Contract No. N00014-05-1-0108. The government has certain rights in the invention.

BACKGROUND OF THE INVENTION

The invention relates to the field of Josephson junction (JJ) devices, and in particular to a superconducting $MgB_2$ Josephson junction (JJ) device having a buffered Si substrate comprising of MgO and $AlB_2$ structure compounds.

Magnesium diboride ($MgB_2$) has attracted extensive studies to fabricate Josephson junctions and circuits that can function between 20-25K using cryocoolers. The goal was to replace the Nb junction technology which requires cooling at liquid helium temperatures. $MgB_2$ Josephson junctions have been fabricated by point contact, ramp type, and various planar structures.

Trilayer Josephson tunnel junctions using $AlO_x$ or AlN as a thin tunnel barrier layer have also been reported. However, the properties of the barrier layer and the $MgB_2$/barrier interface in many of these junctions are not ideal because they are not well understood or difficult to control.

SUMMARY OF THE INVENTION

According to one aspect of the invention, there is provided a Josephson junction (JJ) device. The JJ device includes a buffered substrate having a first buffer layer formed on a substrate. A second buffer layer is formed on the first buffer layer. The second buffer layer includes a hexagonal compound structure. A trilayer structure is formed on the buffered substrate comprising at least two layers of a superconducting material. A thin tunnel barrier layer is positioned between the at least two layers. The buffered substrate is used to minimize lattice mismatch and interdiffusion into the trilayer structure so as to allow the JJ device to operate above 20 K.

According to another aspect of the invention, there is provided a method of forming a Josephson junction (JJ) device. The method includes forming buffered substrate having a first buffer layer formed on a substrate. A second buffer layer is formed on the first semiconductor layer. The second buffer layer includes a hexagonal compound structure. Also, the method includes forming a trilayer structure is formed on the buffered substrate comprising at least two layers of a superconducting material. A thin tunnel barrier layer is positioned between the at least two layers. The buffered substrate is used to minimize lattice mismatch and interdiffusion into the trilayer structure so as to allow the JJ device to operate above 20 K.

BRIEF DESCRIPTION OF THE DRAWINGS

FIG. 1B is a table illustrating various hexagonal elements needed to form a buffered Si substrate.

DETAILED DESCRIPTION OF THE INVENTION

The invention provides a technique for creating superconducting Josephson junction devices. In particular, the invention allows forming functioning trilayer Josephson junction (JJ) devices using a buffered Si substrate.

Figure 1A:
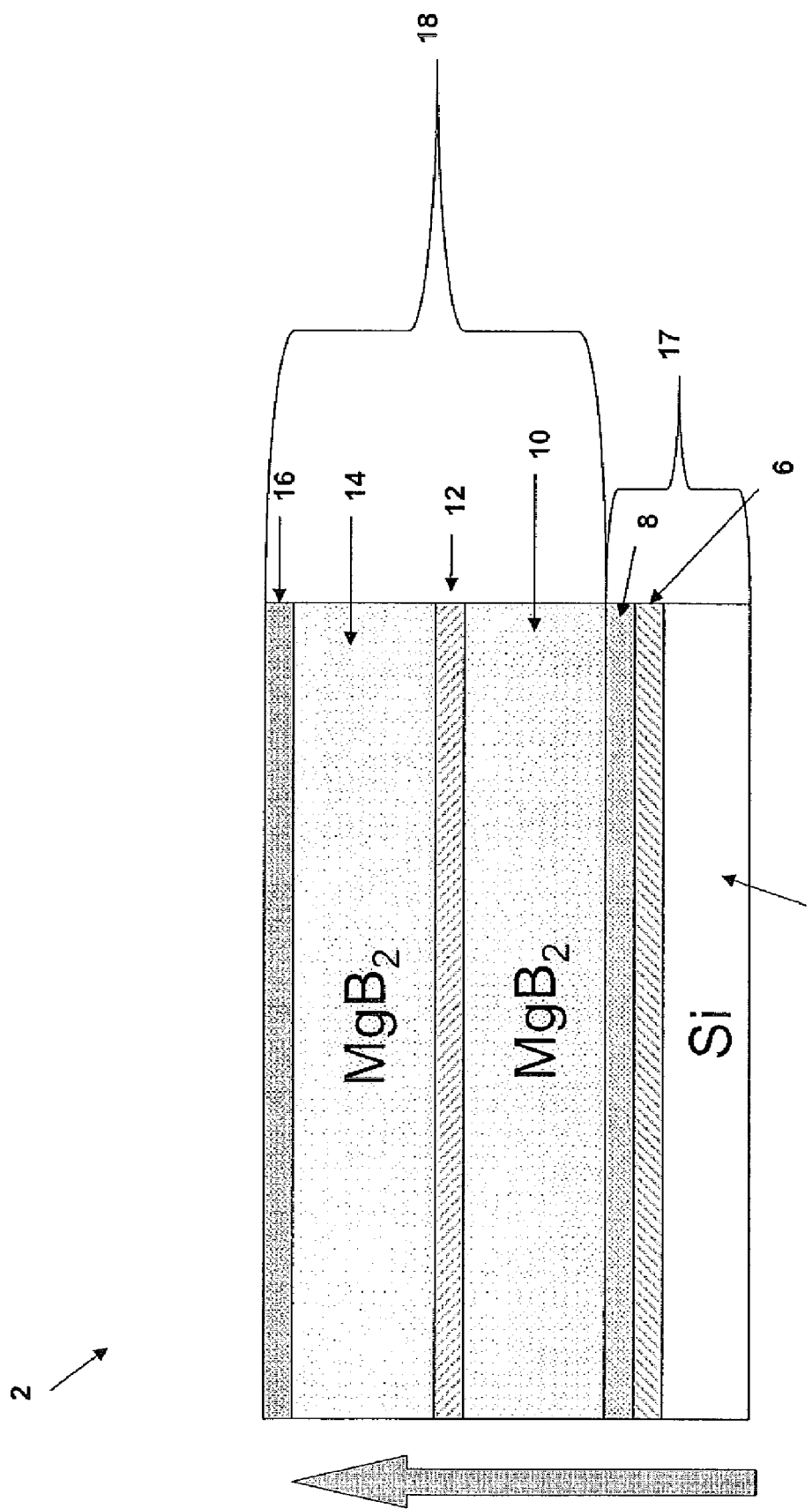
FIG. 1A is a schematic diagram illustrating the inventive Josephson junction (JJ) device and its structure is Si/MgO/$AlB_2$/$MgB_2$/MgO or $Al_2O_3$/$MgB_2$/Au.

FIG. 1A shows the inventive Josephson junction device 2 formed in accordance with the invention. A Si substrate 4 is provided to form a buffer substrate 17. A MgO layer 6 is formed on the Si substrate 4 and a $AlB_2$ layer 8 is formed on the MgO layer 6. The $AlB_2$ layer 8 is selected primarily because it comprises a hexagonal compound structure essential in the formation of the buffer substrate 17. However, other hexagonal compound structures can also be used as shown in FIG. 1B. Essentially, the cell size of each of the various hexagonal compound structures define the quality and durability of buffer Si substrates used by a JJ device.

A trilayer structure 18 is formed on the buffered Si substrate 17. The trilayer structure 18 includes a first $MgB_2$ layer 10 that is formed on the buffered Si substrate 17. An $Al_2O_3$ or MgO layer 12 with a few nm thickness is formed as a tunnel barrier on the $MgB_2$ layer 10. A second $MgB_2$ layer 14 is formed on the $Al_2O_3$ or MgO layer 12. An Au layer 16 formed on the second $MgB_2$ layer 14 to form electrical contacts on the JJ device 2. The buffered substrate 17 is used to minimize lattice mismatch and interdiffusion into the trilayer structure so as to allow the JJ device to operate above 20 K.

A lattice parameter of MgO 6 along [110] direction is 2.98 Å and a-axis lattice parameter of $MgB_2$ 10 is 3.08 Å in FIG. 1B. As a result, the lattice mismatch between MgO layer 6 and $MgB_2$ layer 10 is 3.3%. Thus, among $AlB_2$ compounds in FIG. 1B, some hexagonal compounds 8 having shorter a-axis lattice parameter than MgO 6 can reduce the lattice mismatch.

Figure 1C:
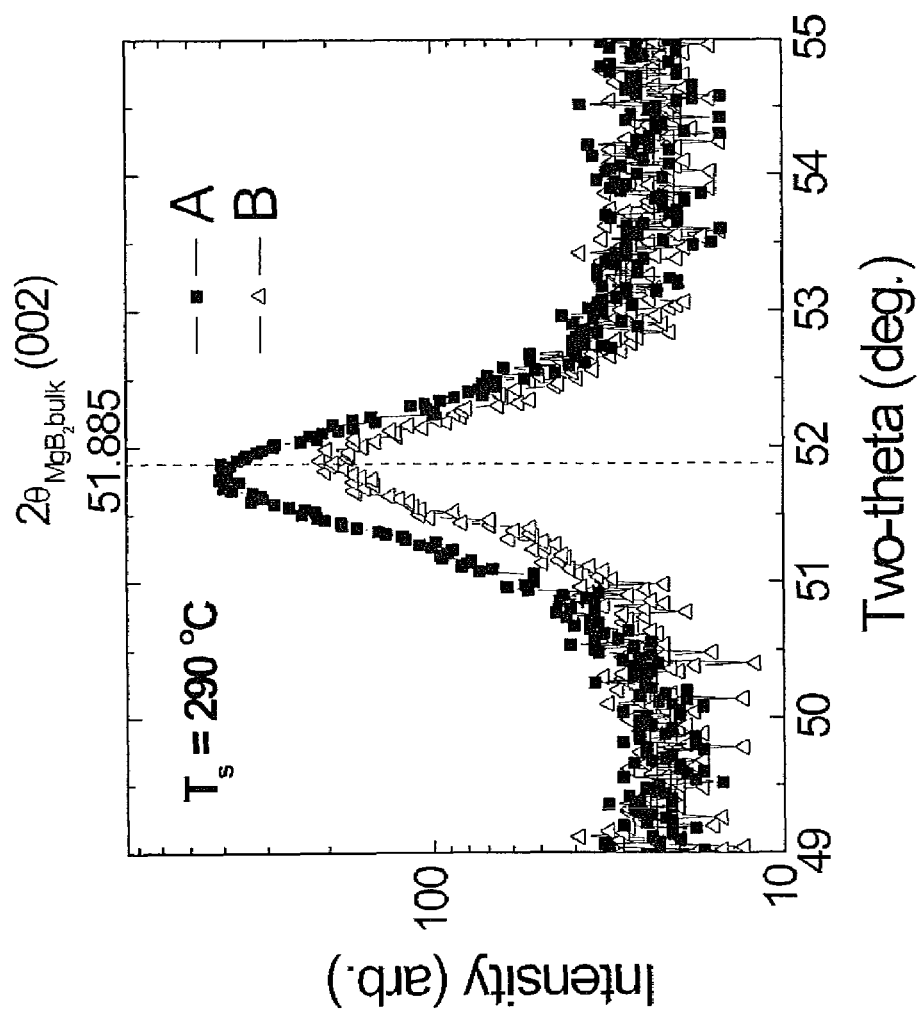
FIG. 1C is a graph illustrating a change of (002) peak of MgB2 from x-ray diffraction measurements.

Actually, x-ray diffraction measurement shows that, by providing a $TiB_2$ layer 8 between MgO 6 and $MgB_2$ 10 layers, the cell size of $MgB_2$ 10 films is close to the $MgB_2$ bulk's value. FIG. 1C is a graph showing a change of (002) peak of $MgB_2$ 10 in the x-ray diffraction measurements for sample A and B. The sample A has $MgB_2$ 10 layer directly grown on MgO 6 layer and the sample B has $TiB_2$ layer between MgO 6 and $MgB_2$ 10 layers. Both samples have the same thickness of $MgB_2$ 10. Compared to the sample A, the (002) peak of the sample B is more close to (002) $MgB_2$ bulk peak, $2\theta=51.885$. It is indicating that the $MgB_2$ 10 having $TiB_2$ layer 8, sample B, has less stress due to the lattice mismatch than the $MgB_2$ 10 without $TiB_2$ 8 layer, sample A.

Figure 1D:
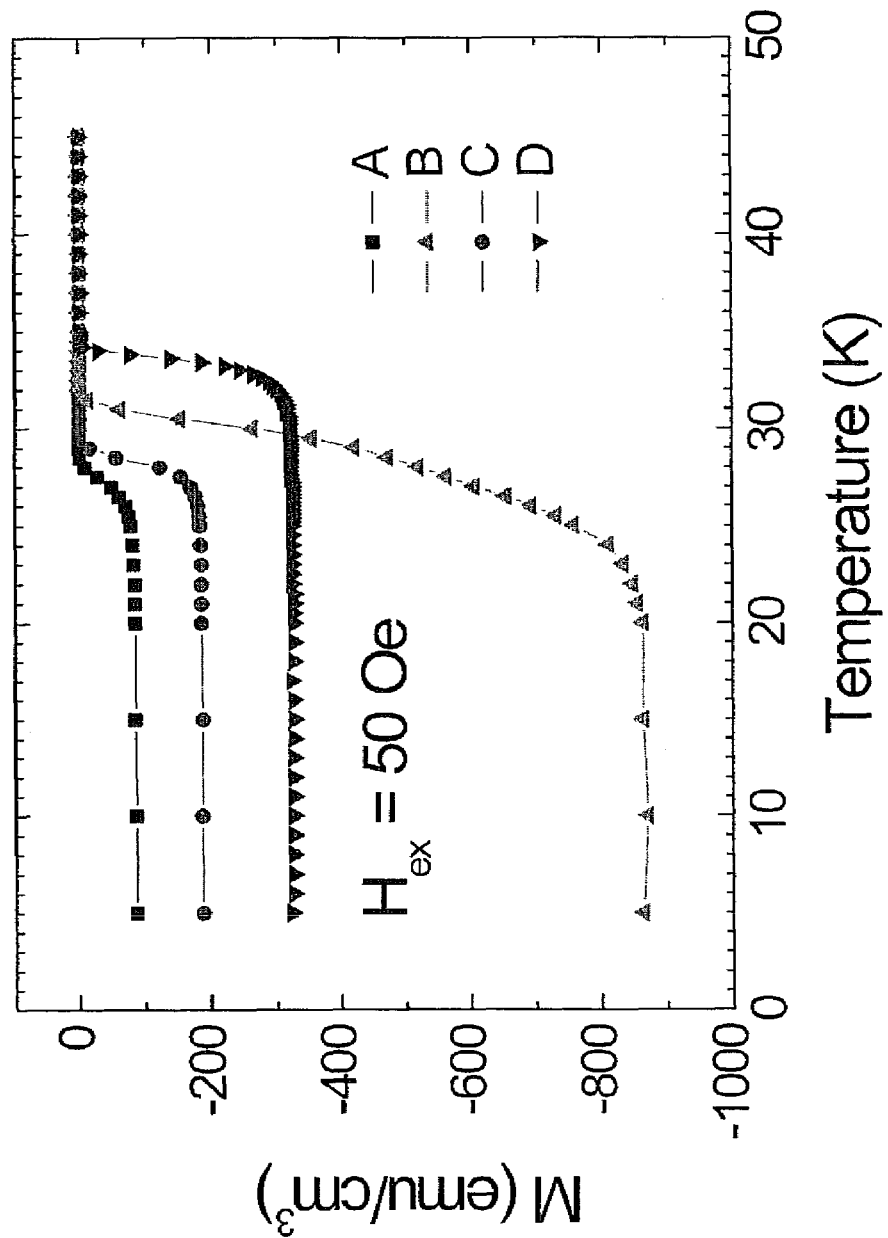
FIG. 1D is a graph illustrating a change of magnetization as a function of temperature to determine superconducting transition temperature ($T_C$) with onset of diamagnetism.

Subsequently, the $AlB_2$ hexagonal compound 8 between MgO 6 and $MgB_2$ 10 layers improves the superconducting transition temperature ($T_C$) of $MgB_2$ layer 10. FIG. 1D shows a change of magnetization as a function of temperature for sample A, B, C, and D. The magnetization measurement was performed with 50 Oe magnetic field applied parallel to the film plane using a superconducting quantum interference device magnetometer. Tc is determined by onset of diamagnetism. As a result, Tc of sample A, B, C, and D is 28 K, 31.5 K, 29 K, and 34 K, respectively. Compared to the sample A, the sample B, C, and D have a higher Tc and they have $AlB_2$ hexagonal compound 8. Hence, the improved Tc of $MgB_2$ due to the $AlB_2$ buffer layer contributes the JJ device to operate at higher temperature.

The other important role of buffer layers is to prevent an interdiffusion between Si substrate and $MgB_2$ layer. Although the Si substrate is more favorable than other oxide crystal substrates in the aspect of production cost as well as device integration, the Si diffusion depresses the superconducting properties of $MgB_2$. Therefore, the introduction of buffer layers between Si substrates and $MgB_2$ layer reduces the interdiffusion and especially $TiB_2$ is known as a good diffusion barrier against Si and metals.

All the layers described in FIG. 1 are grown insitu in one step at temperatures below 300 C with no further annealing. Molecular beam epitaxy can be used to create the structure. The invention can be extended to sputtering deposition techniques as well to form a JJ device. After depositing the layers the JJ device 2 is patterned by photolithography and e-beam lithography into micron and nano sized devices.

The JJ device 2 operates at a temperature range above 20 K using a conventional cryocooler and the speed of this JJ device increases substantially from those used in the prior art. In addition, since an operation temperature of the JJ device 20 is above 20 K, it is unnecessary to use liquid helium so that but can be widely applied with other electronic devices.

Figure 2:
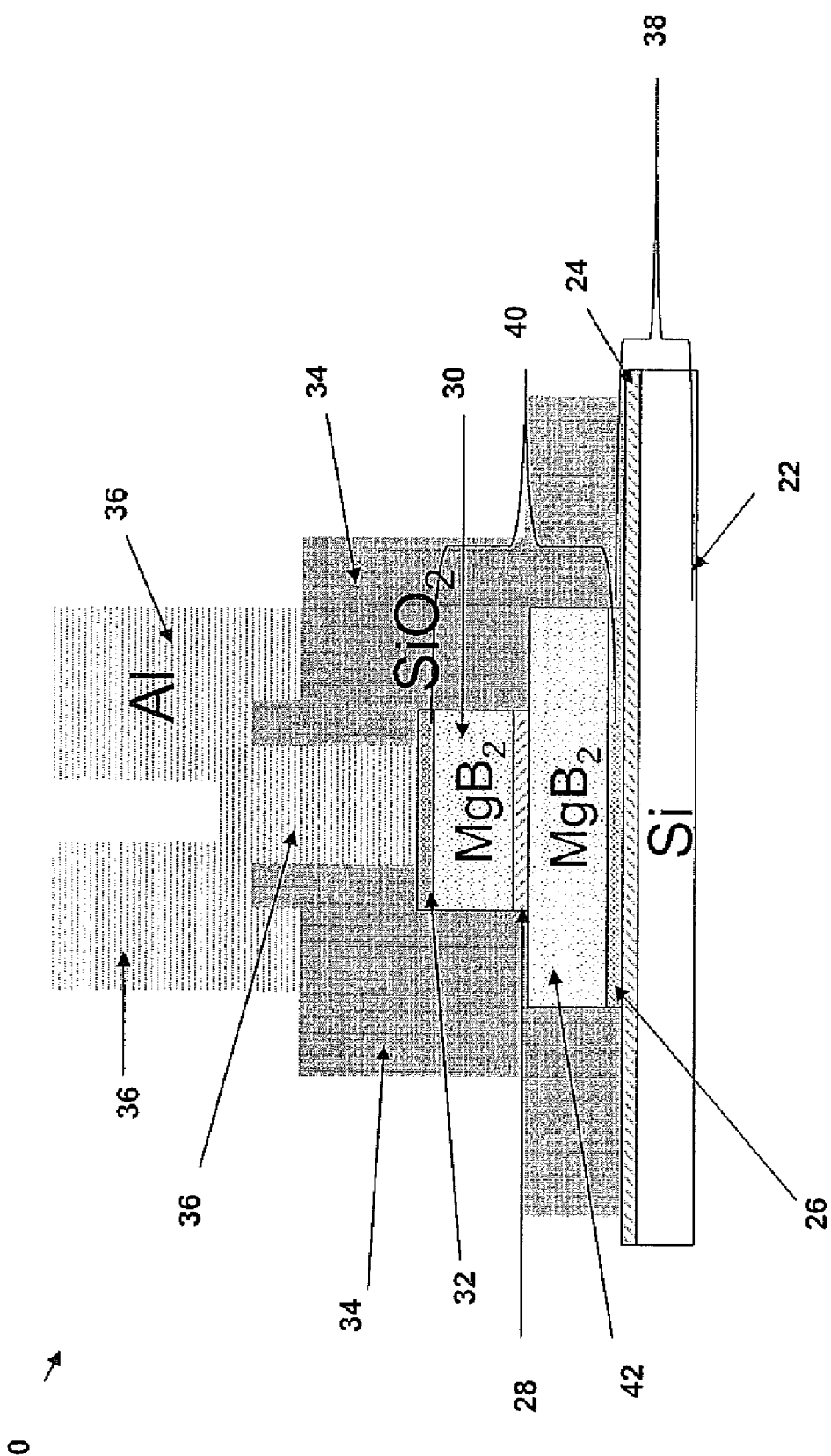
FIG. 2 is a schematic diagram illustrating another embodiment of a JJ device formed in accordance with the invention.

FIG. 2 shows another embodiment of a JJ device 20 formed in accordance with the invention. The JJ device 20 includes a Si substrate 22 is provided to form a buffer substrate 38. A MgO layer 24 is formed on the Si substrate 4 and a $AlB_2$ layer 26 is formed on the MgO layer 24. The $AlB_2$ layer 26 is selected primarily because it comprises a hexagonal compound structure essential in the formation of the buffer substrate 17. As shown FIG. 1B, other hexagonal compound structures can be used.

A trilayer structure 40 is formed on the buffered Si substrate 38. The trilayer structure 40 includes a first $MgB_2$ layer 42 that is formed on the buffered Si substrate 38. An $Al_2O_3$ or MgO layer 28 with a few nm thickness is formed as a tunnel barrier on the $MgB_2$ layer 42. A second $MgB_2$ layer 30 is formed on the $Al_2O_3$ or MgO layer 28. An Au layer 32 is formed on the second $MgB_2$ layer 30 as a capping layer. Also, large layers 34 and 36 of Al and $SiO_2$ are also formed to produce electrical contact and insulation, respectably, to for the JJ device 20. The buffered substrate 38 is used to minimize lattice mismatch and interdiffusion into the trilayer structure so as to allow the JJ device to operate above 20 K.

All the layers described in FIG. 2 are grown insitu in one step at temperatures below 300 C with no further annealing. Other forms of deposition techniques such as molecular beam epitaxy and sputtering deposition techniques can be used to create the structure 20. After depositing the layers the JJ device 20 is patterned by photolithography and e-beam lithography into micron and nano sized devices.

Similar to the JJ device 2 discussed in FIG. 1A, the JJ device 20 also operates at a temperature range above 20 K using a conventional cryocooler and the speed of this JJ device 20 increases substantially from those used in the prior art. In addition, since an operation temperature of the JJ device 20 is above 20 K, it is unnecessary to use liquid helium so that but can be widely applied with other electronic devices.

Figure 3B:
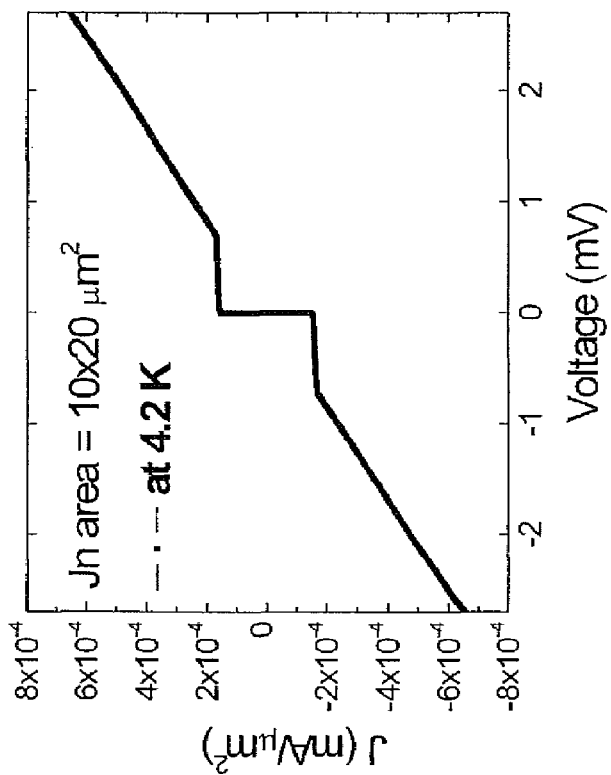
FIGS. 3A-3B are graphs illustrating the current-voltage relationship of the JJ device illustrated in FIG. 2.
Figure 3A:
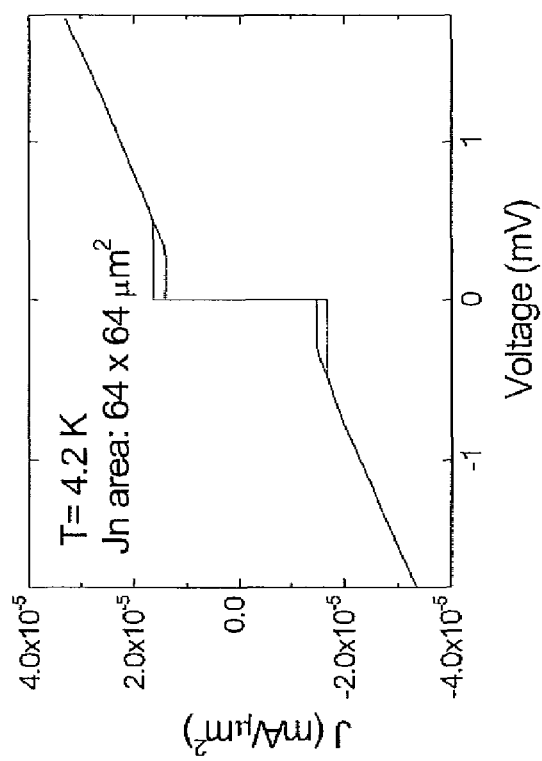

FIGS. 3A-3B shows the current voltage relationship of the JJ device illustrated in FIG. 2, and in particular FIG. 3A shows the current-voltage relationship for a JJ device having a trilayer structure comprising $MgB_2/Al_2O_3/MgB_2$, as described in FIG. 2. FIG. 3B show the current-voltage relationship for a JJ device having a trilayer structure comprising $MgB_2/MgO/MgB_2$, as described in FIG. 2. The clear signature of a JJ device is observed at zero applied voltage. The JJ current is dependent on the magnetic field and microwave radiation typical for such devices. FIGS. 3A-3B show the immediate shift in current when the voltage is at zero, typically seen in JJ devices.

Figure 4A:
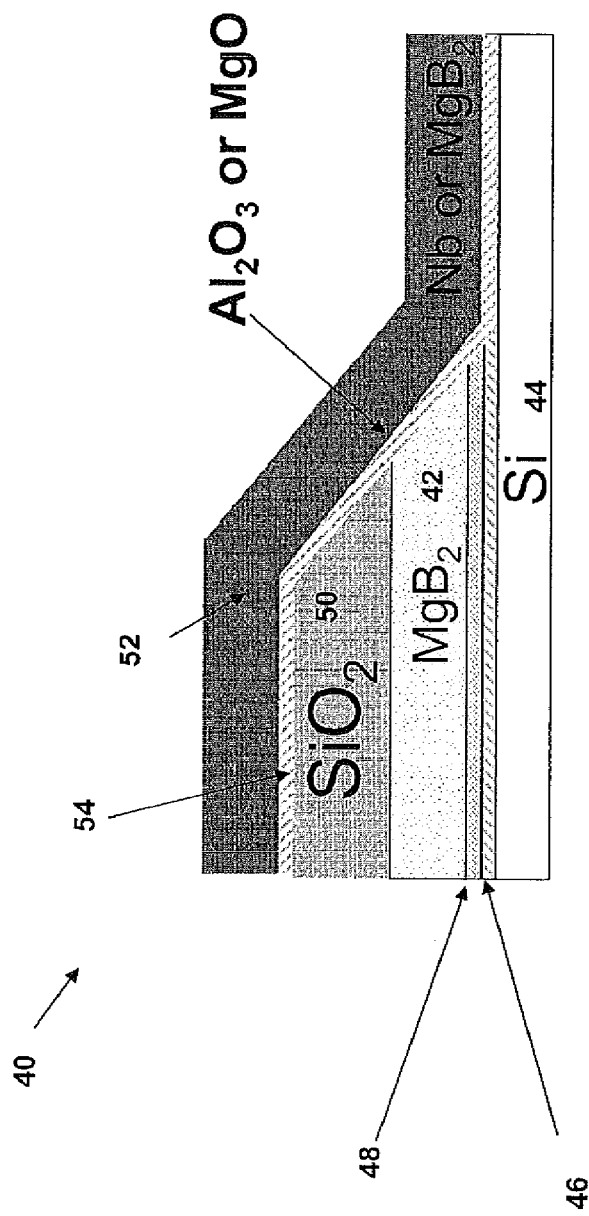
FIG. 4A is a schematic diagram illustrating an applicable embodiment, edge type JJ device, based on the invention.
Figure 4B:
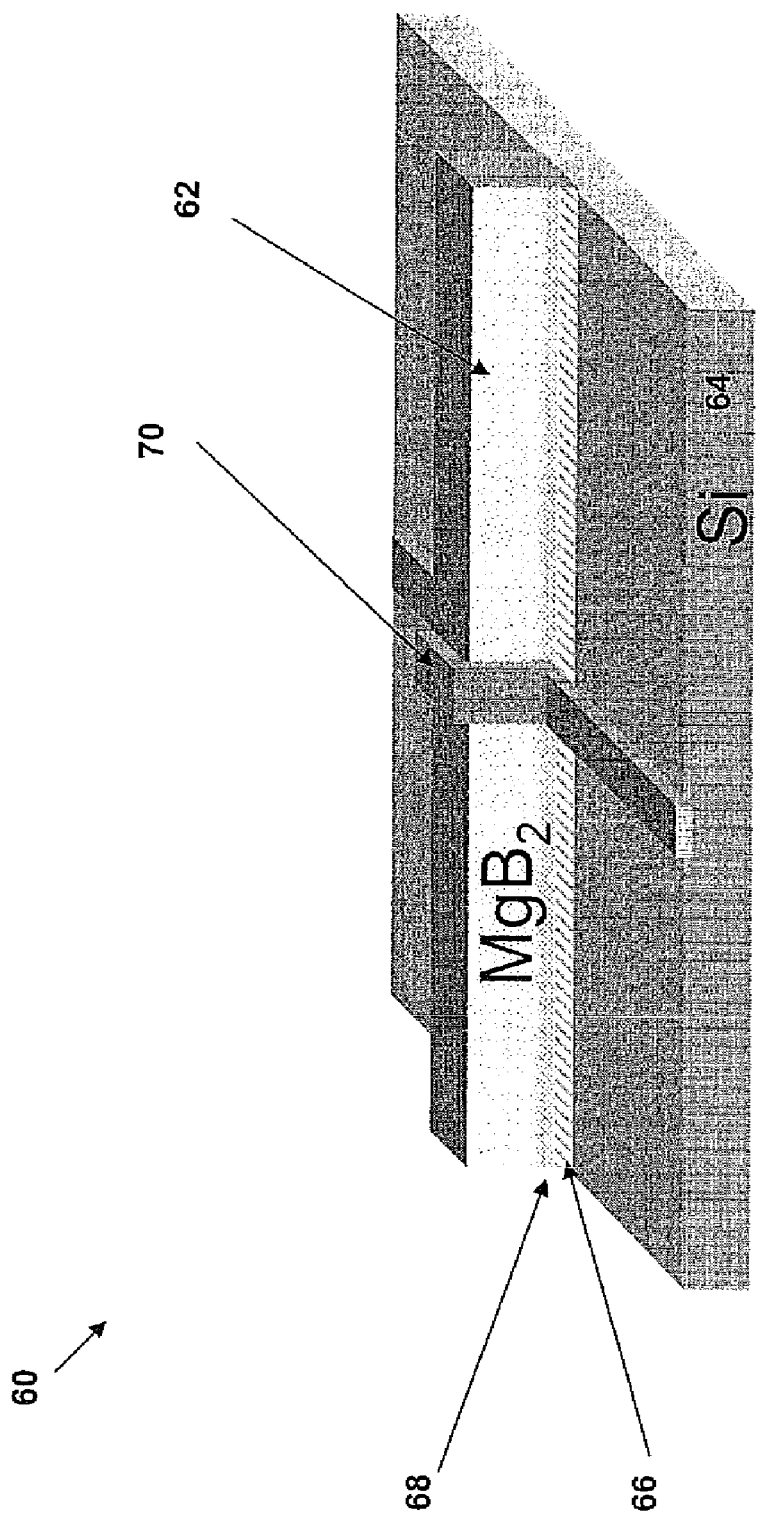
FIG. 4B is a schematic diagram illustrating an applicable embodiment, weak link JJ device, based on the invention.

FIGS. 4A-4B show the applicable JJ device based on the invention. FIG. 4A is an edge type JJ device 40. For making the edge type JJ device 40, the first $MgB_2$ layer 42 is formed on the buffered Si substrate 44 including MgO 46 and $AlB_2$ 48 layers, and a $SiO_2$ layer 50 with a few hundred nm thickness is deposited. By using an ion milling with an angle, the ramp step is formed and a top electrode 52 is deposited. The top electrode 52 can be either $MgB_2$ or a conventional superconductor for example Nb. Underneath the top electrode 52 a layer 54 of either $Al_2O_3$ or MgO is formed.

FIG. 4B shows a weak-link JJ device 60. The weak link JJ device 60 includes just a narrow $MgB_2$ line 70 with nm length normal region in the middle. The first $MgB_2$ layer 62 was deposited on the buffered Si substrate 64 including MgO 66 and $AlB_2$ 68 layers and the narrow $MgB_2$ line is patterned by photolithography and e-beam lithography into nm scale. The normal region can be formed by radiation damage or by depositing a normal metal or a ferromagnet or by a break.

Although the present invention has been shown and described with respect to several preferred embodiments thereof, various changes, omissions and additions to the form and detail thereof, may be made therein, without departing from the spirit and scope of the invention.

What is claimed is:

1. A Josephson junction (JJ) device comprising:
   a buffered substrate comprising a first buffer layer formed on a substrate, a second buffer layer being formed on said first buffer layer, said second buffer layer comprising a hexagonal compound structure; and
   a trilayer structure being formed on said buffered substrate comprising at least two layers of a superconducting material and a thin tunnel barrier layer positioned between said at least two layers; wherein
   said buffered substrate is used to minimize lattice mismatch and interdiffusion in said the trilayer structure so as to allow said JJ device to operate above 20 K.

2. The JJ device of claim 1, wherein said substrate comprises Si.

3. The JJ device of claim 1, wherein said first buffer layer comprise MgO.

4. The JJ device of claim 1, wherein said second buffer comprises $AlB_2$ structure hexagonal compound.

5. The JJ device of claim 1, wherein said superconducting material comprises $MgB_2$.

6. The JJ device of claim 1, wherein said tunnel barrier layer comprises MgO.

7. The JJ device of claim 1, wherein said tunnel barrier layer comprises $Al_2O_3$.

8. The JJ device of claim 1 further comprising fourth metal and insulator layers formed on said the trilayer structure to form electrical contact and insulation to said JJ device.

9. The JJ device of claim 8, wherein said fourth metal layer comprises Au.

10. The JJ device of claim 8, wherein said fourth insulator layer comprises layers of $SiO_2$.

11. The JJ device of claim 8, wherein said fourth metal layer comprises layers of Al.

12. A method of forming a Josephson junction (JJ) device comprising:
    forming a buffered substrate comprising a first buffer layer formed on a substrate, a second buffer layer being formed on said first buffer layer, said second buffer layer comprising a hexagonal compound structure; and forming a trilayer structure on said buffered substrate comprising at least two layers of a superconducting material and a thin tunnel barrier layer positioned between said at least two layers; wherein said buffered substrate is used to minimize lattice mismatch and interdiffusion in said the trilayer structure so as to allow said JJ device to operate above 20 K.

13. The method of claim 12, wherein said substrate comprises Si.

14. The method of claim 12, wherein said first buffer layer comprise MgO.

15. The method of claim 12, wherein said second buffer comprises $AlB_2$ structure hexagonal compound.

16. The method of claim 12, wherein said superconducting material comprises $MgB_2$.

17. The method of claim 12, wherein said tunnel barrier layer comprises MgO.

18. The method of claim 12, wherein said tunnel barrier layer comprises $Al_2O_3$.

19. The method of claim 12 further comprising forming fourth metal and insulator layers formed on said the trilayer structure to form electrical contact and insulation to said JJ device.

20. The method of claim 19, wherein said fourth metal layer comprises Au.

21. The method of claim 20, wherein said fourth insulator layer comprises layers of $SiO_2$.

22. The method of claim 20, wherein said fourth metal layer comprises layers of Al.

* * * * *